United States Patent [19]

Muller

[11] 4,133,690
[45] Jan. 9, 1979

[54] GLASS COMPOSITION FOR PASSIVATING SEMICONDUCTOR SURFACES

[75] Inventor: Gerd Muller, Mainz-Weisenau, Fed. Rep. of Germany

[73] Assignee: Jenaer Glaswerk Schott & Gen., Mainz, Fed. Rep. of Germany

[21] Appl. No.: 678,445

[22] Filed: Apr. 19, 1976

[30] Foreign Application Priority Data

Apr. 22, 1975 [DE] Fed. Rep. of Germany ....... 2517743

[51] Int. Cl.$^2$ ................................................ C03C 3/04
[52] U.S. Cl. .......................................... 106/52; 106/53; 106/54; 357/73; 427/93; 428/325; 428/426; 428/428
[58] Field of Search .................... 428/325, 426, 428; 106/53, 54, 52; 427/93; 357/73

[56] References Cited

U.S. PATENT DOCUMENTS

| | | | |
|---|---|---|---|
| 3,290,565 | 12/1966 | Hastings | 427/93 |
| 3,533,832 | 10/1970 | De Volder | 427/93 |
| 3,679,464 | 7/1972 | Eppler | 428/428 |
| 3,922,471 | 11/1975 | Ellis | 428/428 |
| 3,961,114 | 6/1976 | Berkenblit et al. | 428/428 |

FOREIGN PATENT DOCUMENTS

2323897 12/1973 Fed. Rep. of Germany.

OTHER PUBLICATIONS

Chem. Technology : An Encyclopedia Treatment by Dr. J. F. van Oss, vol. II.

*Primary Examiner*—James J. Bell
*Attorney, Agent, or Firm*—Schwartz & Weinrieb

[57] ABSTRACT

Glass compositions useful for passivating silicon semiconductor elements or bodies and to semiconductor elements or bodies coated by such glass compositions. The glass compositions are applied onto the surface of the semiconductor in the form of a finely ground powder and thereafter fused on at least a portion of the semiconductor element. The compositions comprise: (A) glass and (B) powdered cordierite in an amount effective to provide a coefficient of thermal expansion of up to $40 \times 10^{-7}/°$ C for said composition within the temperature range of 20°–300° C. The compositions are compatible with the thermal expansion of the silicon semiconductor and capable of adhering to the silicon in layers greater than 10 μm without the formation of cracks.

24 Claims, No Drawings

GLASS COMPOSITION FOR PASSIVATING SEMICONDUCTOR SURFACES

BACKGROUND OF THE INVENTION

The present invention relates generally to glass compositions having inert fillers incorporated therein and suitable for the direct passivation of semiconductor surfaces and more particularly, to glass compositions containing cordierite and a thermal expansion compatible with the thermal expansion of silicon and whereby said glass compositions can be applied as coatings for semiconductor devices, and particularly silicon semiconductor devices.

A number of glasses are useful for passivating semiconductor surfaces, i.e., protect semiconductors from any effects of their surroundings. Glasses have been preferred for this purpose in the past. Glasses suitable for providing a passivating and protective coating for the underlying semiconductor unit should have a high electric insulation. In addition, the coefficient of thermal expansion of the glasses should match or complement the coefficient of thermal expansion of the semiconductor material, which is being passivated with said glass so that any applied glass layers coatings will not split off or crack during the cooling process or when exposed to variations in temperature.

The glasses used in the prior art for protecting and passivating silicon semiconductor materials do not ususally have a coefficient of thermal expansion matching or complementing that of silicon because silicon has a relatively small coefficient thermal expansion (about 33 $\times$ 10$^{-7}$/° C.). Although some glasses are known which are similar to silicon in their heat expansion, these glasses are still not satisfactory because they have such high fusing temperatures, i.e., markedly above 1000° C., that they cannot be applied on the semiconductor without causing permanent damage thereto. Thus, only those glasses capable of being used for passivating Si-semiconductors are those which have fusing temperatures below 1000° C. The fusing temeprature of these glasses is the temperature at which the glass powder has softened and liquefied to such a degree that it creates a dense layer, which is free of pores, on the semiconductor surface. However, these glasses as a rule have thermal expansion coefficients which are clearly greater than those for silicon with the values increasing as the fusing temperature decreases.

For example, the first group of glasses, which is frequently used for Si-thyristors and which consists basically of about 40 to 60% by weight PbO, about 5 to 15% by weight Al$_2$O$_3$ and about 30 to 50% by weight SiO$_2$, has a thermal expansion value between 45 and 50 $\times$ 10$^{-7}$/° C. at fusing temperatures of about 900° C. The second and third important groups of glasses, i.e., zinc-silicoborate glasses containing about 60% by weight of ZnO, 20 to 30% by weight of B$_2$O$_3$ and 5 to 15% by weight of SiO$_2$, and lead-borosilicate glasses with about 40 to 50% by weight of PbO, about 40% by weight of SiO$_2$ and about 10% by weight of B$_2$O$_3$, have thermal expansion values of about 45 $\times$ 10$^{-7}$/° C. at fusing temperatures of about 650° to 720° C. Such glasses are frequently utilized for rectifiers, diodes and transistors. The fourth group of glasses, i.e., again lead-borosilicate glasses, but with a higher PbO content of about 70% by weight, has thermal expansion values of more than 60 $\times$ 10$^{-7}$/° C. at fusing temperatures between 500° and 600° C. The latter group of glasses is the preferred material for Si-semiconductor elements, because they are able to withstand particularly low temperature stresses as a result of their thermal sensitivity or because metal contacts have already been applied.

Due to the deviations in thermal expansion which exist in all cases, all of the glasses used in the prior art are compatible with silicon only in the form of thin layers, with the permissible layer thickness becoming progressively reduced as the difference in expansion coefficients becomes greater. For example, when using glasses of the first group mentioned above, which has the highest fusing temperatures, it is possible to use layers of as much as 50 $\mu$m without having cracks or chipping develop during cooling or when exposed to temperature changes, whereas the glasses of the fourth group may be used only in layers of about 1 $\mu$m in thickness.

The restriction to the use of such thin layers creates considerable problems for production engineering. Therefore, expensive processes, e.g., sedimentation, centrifuging or electrophoresis processes have to be used to precipitate, from a suspension, a uniform layer of glass powder onto the semiconductor element, which subsequently can be melted thereon to form a smooth layer which is completely free of pores. It becomes increasingly more difficult to avoid the formation of pores as the layers which are applied become thinner and thinner, and it is possible to achieve pore-free layers only if extremely fine grain sizes of the glass powder are used.

It would therefore be highly advantageous to be able to apply thicker glass layers in many cases, especially since the layers would be less susceptible to mechanical damage. Also, with regard to the electrical aspects, the use of thicker layers would provide better protection for the semiconductor unit because the electrical fields, which escape on the semiconductor surface, would be able to decay within the layer of glass and therefore would not escape to the outside, or become greatly reduced in intensity.

OBJECTS OF THE INVENTION

It is therefore a primary object of the present invention to provide glass compositions compatible with semiconductor bodies and which avoids in substantial part all of the disadvantages set forth herein which are characteristic of prior art glass coatings.

Another significant object of the present invention is the provision of glass compositions capable of providing a high degree of protection and passivation to the underlying semiconductor unit.

A further object of the present invention is to provide glass compositions compatible with silicon that can be applied to semiconductor bodies in thick layers because they are better adapted with respect to their coefficient of thermal expansion coefficient.

BRIEF SUMMARY OF THE INVENTION

Briefly, the present invention relates to glass compositions useful for passivating silicon semiconductor elements or bodies, and to semiconductor elements or bodies coated by such glass compositions. The glass compositions are applied onto the surface of the semiconductor in the form of a finely ground powder and thereafter fused on at least a portion of the semiconductor element. The composition comprises: (A) glass and (B) powdered cordierite in an amount effective to provide a coefficient of thermal expansion of up to 40 $\times$ $10^{-7}/°$ C. for said composition within the temperature range of 20°–300° C. The compositions are compatible with the thermal expansion of the silicon semiconductor and capable of adhering to the silicon in layers greater than 10 μm without the formation of cracks.

According to the present invention, the above objects are satisfied by modifying conventional groups of glasses discussed above by means of fillers whereby their coefficient of thermal expansion becomes compatible with that of silicon. The method of modifying the thermal expansion of glasses by means of the incorporation of fillers into the glass powder and prior to fusing is known from glass soldering technology, e.g., from German Published Patent Application OS 2,313,998-45.

It has been demonstrated however, that the knowledge and experience gained in glass soldering technology can hardly be transferred to passivating glasses for silicon. For example, the frequently used filler β-eucryptite (LiAlSiO$_4$) is unsuitable for use as filler in passivating glasses because it contains alkali ions which begin to migrate under the influence of the high electric fields which enter into the passivating glass from the semiconductor, and thereby eliminate the passivating function. The filler zircon silicate (ZrSiO$_4$) which has been used successfully in glass soldering cannot be utilized either because it has a thermal expansion coefficient of more than $40 \times 10^{-7}/°$ C. and can therefore now effect any reduction of the mixture material's expansion coefficient below $40 \times 10^{-7}/°$ C. as required in accordance with the present invention.

German Published Patent Application OS 2,323,896 describes a semiconductor arrangement which has been coated with a glass of the zinc borosilicate group, as mentioned above, whereby said glass contains a filler in order to have the heat expansion coefficient of the glass material approach that of the semiconductor unit. The fillers mentioned are granulated lead titanate in an amount of 5 to 30% by weight of the glass material, or granulated quartz glass in an amount of 5 to 20% by weight of the glass material. These fillers must be added in a very narrowly defined granular distribution, which in practice is very difficult to maintain, because they otherwise cause cracks in the glass layer or are dissolved to an inadmissably great degree in the glass. Moreover, they have only a very limited effectiveness as regards the reduction of the thermal expansion coefficient; an admixture of 30% by weight of PbTiO$_3$ is not sufficient to reduce the glass' heat expansion from about $49 \times 10^{-7}/°$ C. to $40 \times 10^{-7}/°$ C. Even greater admixtures are essentially ineffective for all practical purposes and in addition, the electrical properties of the mixed material deteriorate significantly.

The fact that the mixed elements listed in the above Published Patent Application may, nevertheless, be utilized for specific semiconductor arrangements even though their thermal expansion is greater than $40 \times 10^{-7}/°$ C. and thus, not similar to the thermal coefficient of silicon, is probably due to the fact that this semiconductor arrangement is composed not only of silicon, but also of aluminum and tungsten. The latter semiconductor material has a considerably higher thermal expansion coefficient, and geometric arrangement of the glass is favorable with regard to any stresses therein. However, these mixed materials cannot achieve general importance as passivating glasses due to the disadvantages described above.

DETAILED DESCRIPTION OF THE INVENTION

A requirement for the passivating glasses of the present invention is that they have a coefficient of thermal expansion lower than $40 \times 10^{-7}/°$ C., for the temperature range of 20-300° C. Thus, thick layers of glass applied to semiconductor bodies or elements do not become damaged even if subjected to stress resulting from temperature changes. Additionally, the fillers used in the practice of this invention must not have any negative influence on the electrical properties of the glass. Hence, neither the conductivity should increase when the filler is added to the glass mixture, not should the dielectric properties be essentially changed due to the presence of the filler.

It has been found that all of the passivating glasses mentioned hereinbefore may be sufficiently modified with regard to their coefficients of thermal expansion by means of the incorporation of effective amounts of cordierite having the approximate molar ratios of $2MgO \times 2Al_2O_3 \times 5 SiO_2$, without the development of any harmful side effects. The results of the incorporation of cordierite is completely unexpected because cordierite is generally not considered to belong to the substances with extremely small, primarily negative coefficients of thermal expansion, such as β-eucryptite of lead titanate. In contrast, the thermal expansion of cordierite is usually quoted as about $15 \times 10^{-7}/°$ C. Cordierites are primarily used, at this time, as a component of ceramic materials because it results in a moderate thermal expansion coefficient and good electrical properties, that is high in insulation and low in dielectric losses, in the ceramic material.

The reason why cordierite is believed to be particularly well suited as a filler for the above-mentioned glasses of the basic systems of PbO-Al$_2$O$_3$-SiO$_2$, PbO-B$_2$O$_3$-SiO$_2$, and ZnO-B$_2$O$_3$-SiO$_2$, is probably that cordierite is subjected to a particularly small corrosion by these glasses. Such corrosion is demonstrated, for example, by the fact that the thermal expansion of the mixed material, consisting of glass and filler, increases as the fusing time and temperature rises. This is the result of a dissolution of the filler caused by the glass, which reduces the effective volume component of the filler and additionally (e.g., in the case of PbTiO$_3$) may have a detrimental influence on the expansion of the glass itself. Moreover, such corrosion may be recognized by the fact that a clear correlation exists between the thermal expansion of the mixed material and the granular size of the filler. Because as the size of the filler grains becomes smaller, their specific surface and, hence, area of contact with the glass becomes greater when the percentage component of the volume is a given quantity. As will be shown below in the examples, the said two effects are practically negligible for cordierite in the passivating glasses described. Although the particle size of the cordierite can vary, cordierite particles generally have a particle size of about 2 to 40 μm and preferably about 5 to 25 μm.

Cordierite is usually produced from the natural raw materials of kaolin and talcum in a sintering reaction. To obtain a purer product with better electrical properties, the cordierite which is to be used as filler in passivating glasses is preferably manufactured from purer starting materials, such as MgCo$_3$ or MgO, SiO$_2$ and Al(OH)$_3$, AlOOH, or Al$_2$O$_3$. A suitable charge was produced, for example, from a stoichiometric mixture of 2 mol $MgCO_3$, 4 mol $Al(OH)_3$ and 5 mol quartz powder ($SiO_2$) by grinding a measured quantity of 5 kg for 24 hours in a ball-type mill, by the subsequent addition of a small quantity of water and the compacting of the material to pills of about 10 cm in diameter and 5 cm in height and by the subsequent sintering at 1250° C. for 24 hours. Then the pills were reground into a powder with granular sizes of <40 μm. The X-ray examination showed that the said powder consisted predominantly of cordierite with very minor traces of quartz residue. The following examples of passivating glasses according to the present invention used cordierite which has been produced in the matter described.

EXAMPLE 1

Starting with the raw materials of quartz sand ($SiO_2$), $Al(OH)_3$, $H_3BO_3$ and minium ($Pb_3O_4$) a glass was molten with the following synthesis composition: $SiO_2$ — 42% by weight, $Al_2O_3$ — 3% by weight, $B_2O_3$ — 10% by weight, and PbO — 45% by weight.

This glass was ground and sifted through a sieve with a 60 μm mesh width. Then 20% by weight of cordierite, in proportion to the total mixture, was added to the glass. The passivating glass produced in this manner (this term was retained in accordance with the customary technical teminology, even though the material is in fact a mixture of a glass and a filler) was applied in the form of an aqueous suspension in a layer of about 250 μm thickness on the surface of Si-rectifiers with mesa-configuration, was dried and was subsequently melted on at 700° C. for 10 minutes. After cooling, the surface (circumference) of the mesa rectifiers was covered with a gap-free, procelain-type white glass layer of about 200 μm thickness, which exhibited no cracks even after it had been treated repeatedly by temperature shocks resulting from ice water and boiling water. The rectifiers which had been coated in this manner showed stable electric properties. The passivating glass was sintered into rods in order to determine the thermal expansion. An expansion of $38 \times 10^{-7}/°$ C. was measured on these rods in comparison to an expansion of $46 \times 10^{-7}/°$ C. for the pure glass without any cordierite modification.

EXAMPLE 2

A zinc borosilicate glass with the synthesis of 60% by weight of ZnO, 10% by weight of $SiO_2$, 24% by weight of $B_2O_3$, 2% by weight of $Al_2O_3$, 3% by weight of PbO, 1% by weight of $Sb_2O_3$ was processed into a powder with a <40 μm granular size. Again, 20% by weight of cordierite with a granular size of <40 μm was added to this powder.

Sintering rods (sinter conditions were 15 minutes at 710° C.) showed a thermal expansion of $39 \times 10^{-7}/°$ C. as compared to $45 \times 10^{-7}/°$ C. for the pure zinc borosilicate glass. Layers of about 100 to 300 μm thickness were produced on level Si-panes with this passivating glass. These layers again showed no inclination towards chipping or the development of cracks.

According to a peferred embodiment of this invention, the cordierite starting material is not produced by a sintering procedure in a ceramic process, but rather the cordierite is produced by crystallization from a glass. It has been found that cordierite which has been crystallized from glass is better with regard to its chemical and structural homogeneity and that it has especially small thermal expansion coefficients.

The preferred method of producing cordierite to be used in the practice of this invention includes the steps of melting a glass having a composition approaching that of cordierite, that is 50% by weight of $SiO_2$, 35% by weight of $Al_2O_3$, 15% by weight of MgO in a quartz cotainer, e.g., at 1600° C. The glass was then poured out into water in order to avoid spontaneous crystallization and was subsequently ground into a powder of <40 μm. The powder was then annealed for 10 hours at 1150° C. to transform the glass into the crystallized state. Then the slightly caked material was reground into a powder of <40 μm. For purposes of comparison, a rod was pressed from the glassy powder and was crystallized at 1150° C. This rod exhibited a heat expansion (range 20°-300° C.) of $-5 \times 10^{-7}/°$ C., which is an unusually low value for cordierite. According to X-ray examinations, both the rod and the uncompacted powder consisted of nothing but cordierite after the heat treatment.

This cordierite is superior as filler material to the cordierite produced in a sintering reaction, as will be shown in the following example.

EXAMPLE 3

A passivating glass was produced from the cordierite crystallized from glass in the described manner and from the zinc borosilicate glass used in Example 2. The cordierite component amounted to 20% by weight as it did in Example 2. A sample rod from this passivating glass showed a thermal expansion of only $35.8 \times 10^{-7}/°$ C. as compared to $39 \times 10^{-7}/°$ C. in Example 2. Moreover, the glass powder formed a smooth, shiny layer on a Si-base with the passivating glass as described in Example 2 only at 710° C. (time needed 15 minutes), whereas the same was achieved at 700° C. (16 minutes) already with the passivating glass which contained cordierite that had been crystallized from glass. The passivating glass of Example 3 was successfully used to passivate Si-rectifiers, which consisted of a stack of cylindrical or slightly conically inclined silicium disks, connected by Al-Si-eutectic soldering and equipped with a p/n junction which is aligned in the same direction, and equipped also with Mo-terminal contacts. In these structural units, the entire stack, including the Mo-contacts, is surrounded by the passivating glass in the form of a pearl. This pearl is first applied on the rectifier stack in the form of an aqueous suspension, is then dried and subsequently sintered. Of 20 structural elements, consisting of stacks of 15 small silicium disks, each, which had been covered with the glass according to Example 2, none exhibited cracks in the glass or any other glass defects; all construction elements had a blocking voltage of about 12 KV, as was to be expected from the type of rectifier used.

EXAMPLE 4

A glass was produced from the first group of glasses described in this specification with the following oxide composition and was processed into a powder with a 60 μm maximum granular size: PbO — 50% by weight, $Al_2O_3$ — 10% by weight, $SiO_2$ — 40% by weight. This glass has a coefficient of thermal expansion of $43 \times 10^{-7}/°$ C. A passivating glass composition produced from this glass and having 10% by weight (based on the total weight of said composition) of cordierite admixed therewith, said cordierite having been crystallized from glass, showed a thermal expansion coefficient of $38 \times 10^{-7}/°$ C. The pure, unmodified glass is frequently utilized for passivating thyristors; but it may be applied for only this purpose in layers of no more than 40 μm because of its thermal expansion and because if would otherwise chip off. This requires a granular size of < 20 μm for the glass powder. The cordierite modified glass could be applied in layers of more than 100 μm without any negative or adverse effect on mechanical adhesion. Therefore coarser glass powder could be processed, which was less expensive to produce. Moreover, the layering could be achieved simply by applying the glass powder, which had been mixed into a paste with water, instead of having to use the complicated sedimentation process, thereby resulting in a considerable saving in labor.

EXAMPLE 5

A powder with a granular size of < 40 μm consisting of (A) glass with the composition of 70% by weight of PbO, 20% by weight of $SiO_2$ and 10% by weight of $B_2O_3$; was mixed with (B) 35% by weight (based on the total weight of the composition) of the cordierite of the type described hereinbefore which had been crystallized from glass (grain size < 60 μm). This powder was used in layers of about 100 μm thickness which were applied on level Si-panes and were melted on at 600° C. for 15 minutes. These layers did not have any cracks. Yet, layers of only 10 μm thickness of the basic glass, without cordierite admixed therewith, which were applied on a Si-base, showed a clear network of fine cracks.

The preceding examples were designed to illustrate the scope of the present invention but were not intended to limit same.

The positive effect of the cordierite filler is not restricted to the glasses listed in the examples, but can be achieved basically also with all of the zinc-borosilicate-, lead-borosilicate- and lead-aluminum silicate glasses of the general compositions described earlier as well as the glasses which fall in between these composition ranges. Thus, the glasses useful in the practice of this invention include those conventional passivating glasses having a coefficient of thermal expansion of up to about 70 × $10^{-7}/°$ C. in the temperature range of from 20° to 200° C. and a fusing temperature below 1000° C. These glasses generally consist of the components (a) $SiO_2$, $Al_2O_3$ and PbO, or of the components (b) $SiO_2$, $B_2O_3$ and ZnO, or (c) of other mixtures thereof. These glasses preferably consist essentially of about 60% by weight ZnO, about 20 to 30% by weight of $B_2O_3$, about 5 to 15% by weight $SiO_2$, and generally minor amounts, i.e., amounts up to 5% by weight, of additional oxides, e.g., PbO, $Sb_2O_3$, $CeO_2$ $SnO_2$ and $Bi_2O_3$. Another preferred mixture of said passivating glasses consist essentially of about 10 to 50% by weight $SiO_2$, from 0 to 30% by weight $B_2O_3$, from 0 to 20% by weight $Al_2O_3$ and from 35 to 75% by weight PbO. The difference between the thermal expansion of silicon and that of the glass used for passivating must, however, not be too great so that it can be balanced by the cordierite admixture. It has been found that a difference of about 40 × $10^{-7}/°$ C. represents a practical limit for this purpose because such large admixtures of cordierite are necessary otherwise the viscosity of the glass becomes too impaired and makes it impossible to achieve a smooth, dense application of the passivating layer. On the other hand, it is generally necessary to obtain a thermal expansion of below 40 × $10^{-7}/°$ C., or at any rate not much greater than 40 × $10^{-7}/°$ C., by means of cordierite admixtures if crack-free layers are to be assured.

As has been shown above, the cordierite filler of the invention may be produced either in a sinter reaction process, or preferably by means of a crystallization of a pre-molten glass. It has been found that the most favorable compositions are those which approach the mol ratio of 2 MgO × 2 $Al_2O_3$ × 5 $SiO_2$. Since the development of mixture crystals is possible in the structure of the cordierite, this composition need not be adhered to rigidly. However, any such deviations do not result in any noticible advantage. In all cases, the filler should consist as fully as possible, or at least with 90% by weight, of crystalline cordierite so as to assure that the effect according to the invention is assured.

The amount of cordierite generally incorporated into the passivating glass compositions of this invention are amounts effective to provide a coefficient of thermal expansion of up to 40 × $10^{-7}/°$ C. Effective amounts generally range from about 5 to 40% by weight and preferably 8 to 35% by weight based on the total weight of the composition.

When the passivating glass compositions are applied to a semiconductor body in the form of a coating, the coatings are generally of about 30 to 50 μm and preferably 50 to 80 μm in thickness. The passivating glass compositions are generally processed into a powder prior to application to the semiconductor body, with a granular size for both the cordierite and glass component of up to about 50 μm and preferably between about 2 and 40 μm.

The glass component may contain other constituents such as $Sb_2O_3$, $CeO_2$ $SnO_2$ and $Bi_2O_3$ in smaller amounts and generally in amounts by weight between 0.1 and 5 weight percent based on the weight of the total glass composition. ACCORDINGLY,

What is claimed is:

1. Glass compositions useful for passivating silicon semiconductor elements which are applied on the surface of said semiconductor in the form of a finely ground powder and thereafter fused on at least a portion of said semiconductor element without any gap, said composition comprising: (A) glass capable of passivating semiconductor surfaces, in combination with (B) powdered cordierite in an amount effective to provide a coefficient of thermal expansion of up to 40 × $10^{-7}/°$ C. for said composition comprising (A) and (B) within the temperature range of 20°-300° C., whereby said compositions are compatible with the thermal expansion of said silicon semiconductor and capable of adhering to the silicon in layers of greater than 10 μm without the formation of cracks.

2. The composition of claim 1, wherein said cordierite consists essentially of about 2 moles MgO, 2 moles $Al_2O_3$ and 5 moles $SiO_2$.

3. The composition of claim 1, wherein component (A) has a fusing temperature below 1000° C.

4. The composition of claim 1, wherein component (A) consists essentially of the components: (a) $SiO_2$, $Al_2O_3$ and PbO, (b) $SiO_2$, $B_2O_3$ and ZnO, or (c) mixtures of said components wherein each of said mixtures has a coefficient of thermal expansion of up to about 70 × $10^{-7}/°$ C. in the temperature range of from 20° to 200° C.

5. The composition of claim 4, wherein component (A) consists essentially of (a) about 60 weight percent ZnO, (b) about 20-30 weight percent $B_2O_3$, (c) about 5-15 weight percent $SiO_2$ and (d) up to 5 weight percent of at least one oxide selected from the group consisting of PbO, $Sb_2O_3$, $CeO_2$, $SeO_2$ and $BiO_2$.

6. The composition of claim 4, wherein component (A) consists essentially of: (a) about 10-50 weight percent $SiO_2$, (b) about 0–30 weight percent $B_2O_3$, (c) about 0–20 weight percent $Al_2O_3$, and (d) about 35–75 weight percent PbO.

7. The composition of claim 6, wherein component (A) consists essentially of: (a) about 40–50 weight percent PbO, (b) about 40 weight percent $SiO_2$ and (c) about 10 weight percent $B_2O_3$.

8. The composition of claim 6, wherein component (A) consists essentially of: (a) 45 weight percent PbO, (b) 42 weight percent $SiO_2$, (c) 10 weight percent $B_2O_3$, and (d) 45 weight percent PbO.

9. The composition of claim 8 containing 20 weight percent of component (B) based on the total weight of the composition.

10. The composition of claim 6, wherein component (A) consists essentially of: (a) 50 weight percent PbO, (b) 40 weight percent $SiO_2$, and (c) 10 weight percent $Al_2O_3$.

11. The composition of claim 10, containing 10 weight percent of cordierite based on the total weight of the composition.

12. The composition of claim 1, wherein said cordierite powder is produced by crystallization of a glass composition having an approximate molar ratio of 2 MgO × 2 $Al_2O_3$ × 5 $SiO_2$.

13. In combination, a semiconductor body having a surface and, on said surface, a glass coating composition of claim 1.

14. The semiconductor combination of claim 13, wherein said cordierite consists essentially of about 2 moles MgO, 2 moles $Al_2O_3$ and 5 moles $SiO_2$.

15. The semiconductor combination of claim 13, wherein component (A) has a fusing temperature below 1000° C.

16. The semiconductor combination of claim 13, wherein component (A) consists essentially of the components: (a) $SiO_2$, $Al_2O_3$ and PbO, (b) $SiO_2$, $B_2O_3$ and ZnO, or (c) mixtures of said components wherein each of said mixtures has a coefficient of thermal expansion of up to about 70 × $10^{-7}$/° C. in the temperature range of from 20° to 200° C.

17. The semiconductor combination of claim 16, wherein component (A) consists essentially of (a) about 60 weight percent ZnO, (b) about 20–30 weight percent $B_2O_3$, (c) about 5–15 weight percent $SiO_2$ and (d) up to 5 weight percent of at least one oxide selected from the group consisting of PbO, $Sb_2O_3$, $CeO_2$, $SeO_2$ and $BiO_2$.

18. The semiconductor combination of claim 16, wherein component (A) consists essentially of: (a) about 10–50 weight percent $SiO_2$, (b) about 0–30 weight percent $B_2O_3$, (c) about 0–20 weight percent $Al_2O_3$ and (d) about 35–75 weight percent PbO.

19. The semiconductor combination of claim 18, wherein component (A) consists essentially of: (a) about 40–50 weight percent PbO, (b) about 40 weight percent $SiO_2$ and (c) about 10 weight percent $B_2O_3$.

20. The semiconductor combination of claim 19, wherein component (A) consists essentially of: (a) 45 weight percent PbO, (b) 42 weight percent $SiO_2$, (c) 10 weight percent $B_2O_3$ and (d) 45 weight percent PbO.

21. The semiconductor combination of claim 20, containing 20 weight percent of component (B) based on the total weight of the composition.

22. The semiconductor combination of claim 18, wherein component (A) consists essentially of: (a) 50 weight percent PbO, (b) 40 weight percent $SiO_2$, and (c) 10 weight percent $Al_2O_3$.

23. The semiconductor combination of claim 22, containing 10 weight percent of cordierite based on the total weight of the composition.

24. The semiconductor combination of claim 13, wherein said ocrdierite powder is produced by crystallization of a glass composition having an approximate molar ratio of 2 MgO × 2 $Al_2O_3$ × 5 $SiO_2$.

* * * * *